US012087582B2

(12) United States Patent
Jin

(10) Patent No.: US 12,087,582 B2
(45) Date of Patent: Sep. 10, 2024

(54) IMPROVING RESOLUTION OF MASKS FOR SEMICONDUCTOR MANUFACTURE

(71) Applicants: Semiconductor Manufacturing International (Shanghai) Corporation, Shanghai (CN); Semiconductor Manufacturing International (Beijing) Corporation, Beijing (CN)

(72) Inventor: Jisong Jin, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 524 days.

(21) Appl. No.: 17/344,457

(22) Filed: Jun. 10, 2021

(65) Prior Publication Data
US 2022/0028692 A1    Jan. 27, 2022

(30) Foreign Application Priority Data

Jul. 24, 2020  (CN) .......................... 202010725642.3

(51) Int. Cl.
*H01L 21/033*    (2006.01)
*H01L 21/768*    (2006.01)
(52) U.S. Cl.
CPC ...... *H01L 21/0337* (2013.01); *H01L 21/0332* (2013.01); *H01L 21/76816* (2013.01); *H01L 21/0338* (2013.01)

(58) Field of Classification Search
CPC .......................................... H01L 21/0337–0338
See application file for complete search history.

(56) References Cited

U.S. PATENT DOCUMENTS

2014/0051247 A1* 2/2014 Cheng ............... H01L 21/31144
                                                                438/689
2018/0151363 A1* 5/2018 Su ..................... H01L 21/76816

FOREIGN PATENT DOCUMENTS

CN           114639604 A  *  6/2022  ....... H01L 21/76802

* cited by examiner

*Primary Examiner* — Kevin Parendo
(74) *Attorney, Agent, or Firm* — Anova Law Group, PLLC

(57) ABSTRACT

Semiconductor structures and fabrication methods are provided. The method includes providing a to-be-etched layer having first regions, second regions and third regions; forming a first core layer on a first region; forming a first sidewall spacer on sidewalls of the first core layer; forming a sacrificial layer covering a portion of the first sidewall spacer on the to-be-etched layer, having a plurality of initial first openings and with a portion of the initial first opening exposing a portion of the first sidewall spacer on the second region; removing the portion of the first sidewall spacer exposed by the portion of the initial first opening to form a first opening; forming a second sidewall spacer in the first opening; and forming second openings in the sacrificial layer. The second openings expose one of or both a portion of the first sidewall spacer and a portion of the second sidewall spacer.

16 Claims, 8 Drawing Sheets

IMPROVING RESOLUTION OF MASKS FOR SEMICONDUCTOR MANUFACTURE

CROSS-REFERENCE TO RELATED APPLICATION

This application claims the priority of Chinese Patent Application No. 202010725642.3, filed on Jul. 24, 2020, the content of which is incorporated by reference in its entirety.

TECHNICAL FIELD

The present disclosure generally relates to the field of semiconductor manufacturing technology and, more particularly, relates to semiconductor structures and fabrication methods.

BACKGROUND

With the improvement of integration level and the increase of the scale of circuits, the size of individual devices in the circuits has been shrinking, and the requirements for the manufacturing process of integrated circuits (ICs) have been increased. For example, the critical dimension (CD) has been continuously decreased, and the chip manufacturing has higher and higher requirements for the resolution of the lithography process.

In the process of manufacturing semiconductor devices, a photolithography process is usually used to transfer the patterns on a mask to a substrate. The photolithography process includes providing a semiconductor substrate, forming a photoresist layer on the semiconductor substrate, exposing and developing the photoresist layer to form a patterned photoresist layer such that the patterns on the mask layer are transferred to the photoresist layer; etching the semiconductor substrate using the patterned photoresist layer as a mask such that the patterns on the patterned photoresist layer are transferred to the semiconductor substrate; and removing the photoresist layer.

However, there is still a need to improve the pattern transfer process. The disclosed methods and semiconductor structures are directed to solve one or more problems set forth above and other problems in the art.

SUMMARY

One aspect of the present disclosure provides a method for forming a semiconductor structure. The method may include providing a to-be-etched layer. The to-be-etched layer includes a plurality of first regions arranged in parallel along a first direction, a plurality of second regions arranged in parallel along the first direction and a plurality of third regions arranged in parallel along the first direction, and a second region of the plurality of second regions is adjacent to a first region of the plurality of first regions and a third region of the plurality of third regions. The method may also include forming a first core layer on the first region of the plurality of first regions. The first core layer extends along a second direction perpendicular to the first direction. Further, the method may include forming a first sidewall spacer on sidewall surfaces of the first core layer; and forming a sacrificial layer covering a portion of the first sidewall spacer on the to-be-etched layer. The sacrificial layer includes a plurality of initial first openings, an initial first opening of the plurality of initial first openings is on the second region, the initial first opening extends along the second direction, and a portion of the initial first opening exposes a portion of the first sidewall spacer on the second region. Further, the method may include removing the portion of the first sidewall spacer exposed by the portion of the initial first opening to form a first opening; forming a second sidewall spacer in the first opening; and forming a plurality of second openings in the sacrificial layer. A second opening of the plurality of second openings exposes one or both the portion of a first sidewall spacer and a portion of the second sidewall spacer.

Optionally, the method for forming the first core layer may include forming a first core material layer on the to-be-etched layer; forming a first patterned layer on the first core material layer, wherein the first patterned layer includes a first patterned opening exposing a portion of the first core material layer; and etching the first core material layer using the first patterned layer as a mask until a top surface of the to-be-etched layer is exposed to form the first core layer.

Optionally, the method for forming the first sidewall spacer may include forming a first sidewall spacer material layer on the sidewall surfaces and a top surface of the first core layer and a top surface of the to-be-etched layer; and etching the first sidewall spacer material layer until the top surface of the first core layer and the top surface of the to-be-etched layer are exposed to form the first sidewall spacer.

Optionally, a method for forming the first sidewall spacer material layer includes an atomic layer deposition process.

Optionally, the method for forming the sacrificial layer and the plurality of initial first openings includes forming a second core layer on the second region, wherein the second core layer extends along the second direction and covers a portion of the first sidewall spacer; forming an initial sacrificial layer covering the first sidewall spacer and the first core layer on the to-be-etched layer; etching back the initial sacrificial layer until a top surface of the first sidewall spacer and the top surface of the first core layer to form the sacrificial layer; and after removing the sacrificial layer, removing the second core layer to form the plurality of first openings.

Optionally, a method for etching back the initial sacrificial layer includes one or more of a dry etching process and a wet etching process.

Optionally, the method for forming the second core layer includes forming a second core material layer on the to-be-etched layer; forming a second patterned layer having a second patterned opening exposing a portion of the second core material layer on the second core material layer; and etching the second core material layer using the second patterned layer as a mask until the top surface of the to-be-etched layer is exposed to form the second core layer.

Optionally, a material of the second core material layer may include organic material, silicon oxide, or amorphous carbon.

Optionally, a material of the first core layer includes one or more of polysilicon, amorphous silicon, silicon oxide, silicon nitride, and amorphous carbon.

Optionally, a thickness of the first sidewall spacer is same as a thickness of the second sidewall spacer; a material of the first sidewall spacer is same as a material of the second sidewall spacer; and the material of the first sidewall spacer and the second sidewall spacer includes one or more of silicon oxide, silicon nitride, aluminum oxide, aluminum nitride, titanium nitride and titanium oxide.

Optionally, a material of the sacrificial layer includes spin-coated silicon oxide, metal oxide, polysilicon, or amorphous silicon.

Optionally, after forming the plurality of second openings, the method may further include removing the first core layer to form a plurality of third openings in the sacrificial layer.

Optionally, the to-be-etched layer includes a substrate and a first mask layer on the substrate.

Optionally, after forming the first core layer, the method further includes etching the first mask layer using the sacrificial layer, the first sidewall spacer and the second sidewall spacer as a mask to form a plurality of transitional trenches in the first mask layer.

Optionally, after forming the plurality of transitional trenches, the method further includes etching the semiconductor substrate using the first mask layer as a mask to form a plurality of target trenches in the semiconductor substrate.

Optionally, after forming the plurality of target trenches, the method further includes forming a conductive layer in each of the plurality of target trenches, respectively.

Another aspect of the present disclosure includes providing a semiconductor structure. The semiconductor structure may include a substrate having a plurality parallel first regions, a plurality of parallel second regions and a plurality of parallel third regions, wherein a first region of the plurality of first regions is adjacent to a second region of the plurality of second regions and a third region of the plurality of third regions; and a conductive layer in each of the plurality of first regions, the plurality of second regions and the plurality of third regions. The semiconductor structure is formed by providing a to-be-etched layer having the semiconductor substrate and a first hard mask layer on the semiconductor substrate, wherein the to-be-etched layer includes the plurality of first regions, the plurality of second regions and the plurality of third regions; forming a first core layer on the first region of the plurality of first regions, wherein the first core layer extends along a second direction perpendicular to the first direction; forming a first sidewall spacer on sidewall surfaces of the first core layer; forming a sacrificial layer covering a portion of the first sidewall spacer on the to-be-etched layer, wherein the sacrificial layer includes a plurality of initial first openings, an initial first opening of the plurality of initial first openings is on the second region, the initial first opening extends along the second direction, and a portion of the initial first opening exposes a portion of the first sidewall spacer on the second region; removing the portion of the first sidewall spacer exposed by the portion of the initial first opening to form a first opening; forming a second sidewall spacer in the first opening; forming a plurality of second openings in the sacrificial layer, wherein a second opening of the plurality of second openings exposes one of or both the portion of the first sidewall spacer and a portion of the second sidewall spacer; removing the first core layer to form a plurality of third openings in the sacrificial layer; etching the first mask layer using the sacrificial layer, the first sidewall spacer and the second sidewall spacer as a mask to form a plurality of transitional trenches in the first mask layer; etching the substrate using the first mask layer as a mask to form a plurality of target trenches in the substrate; and forming the conductive layer in each of the plurality of target trenches, respectively.

Optionally, a material of the conductive layer includes one or more of copper, aluminum, tungsten, cobalt, tantalum, tantalum nitride, titanium, titanium nitride, ruthenium, ruthenium nitride, and graphene.

Optionally, a material of the first mask layer includes one or more of titanium nitride, tungsten carbide, silicon oxide, silicon oxycarbide, and silicon oxycarbonitride.

Optionally, the to-etched layer also includes a bottom hard mask layer on the substrate, wherein the first mask layer is on the bottom hard mask layer; and a material of the bottom hard mask layer includes one or more of silicon oxide, titanium nitride, tungsten carbide, silicon carbide, silicon carbonitride, silicon oxycarbide, aluminum oxide, and aluminum nitride.

Thus, the technical solutions of the present disclosure may have the following advantages.

In the technical solutions of the present disclosure, a first core layer may be formed on a plurality of the first regions first, and the first core layer may define the positions of the subsequent third openings. A first sidewall spacer may be formed on the first core layer, and the initial first openings and the second openings may be formed by the self-aligned etching of the first sidewall spacer. Thus, the position deviation of the initial first opening and the second opening relative to the third opening may be reduced. By adjusting the thickness of the first sidewall spacer and the second sidewall spacer, the adjustment of the spacings between each of the subsequently formed conductive layers may be achieved. Accordingly, the adjustment of the spacings between each of the conductive layers may be controllable to realize the requirements of the final electrical structure. Thus, the performance of the final formed semiconductor structure may be improved.

Further, the thickness of the first sidewall spacer and the second sidewall spacer may be same. By setting the thickness of the first sidewall spacer and the second sidewall spacer to be the same, the spacings between the subsequently formed conductive layers may also be same. Thus, the deviation of the electrical performance between the conductive layers may be reduced, and the performance of the final semiconductor structure may be improved.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Figure 1:
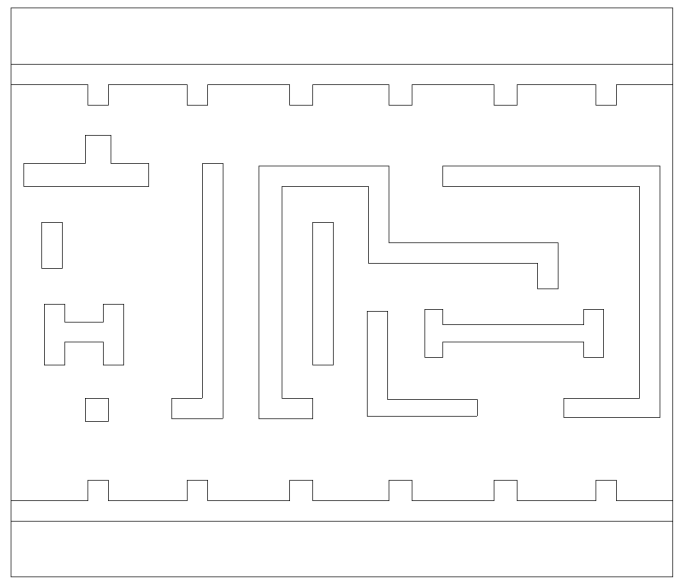
FIGS. 1-3 illustrate structures corresponding to certain stages during forming a semiconductor structure.
Figure 2:
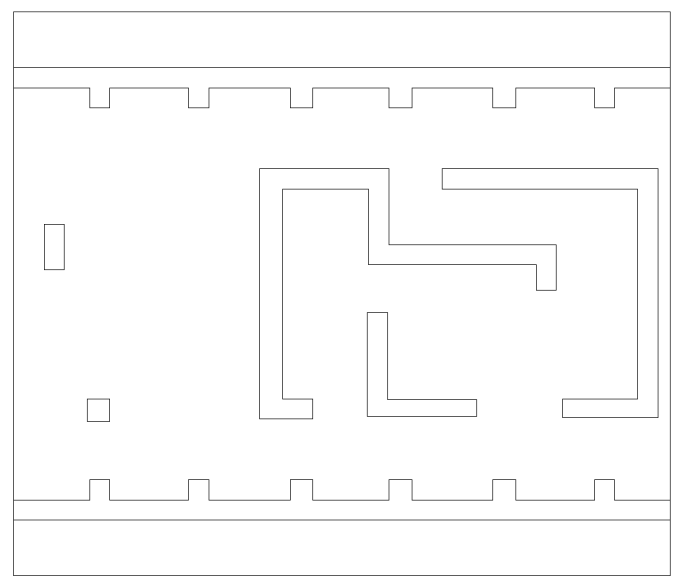
Figure 3:
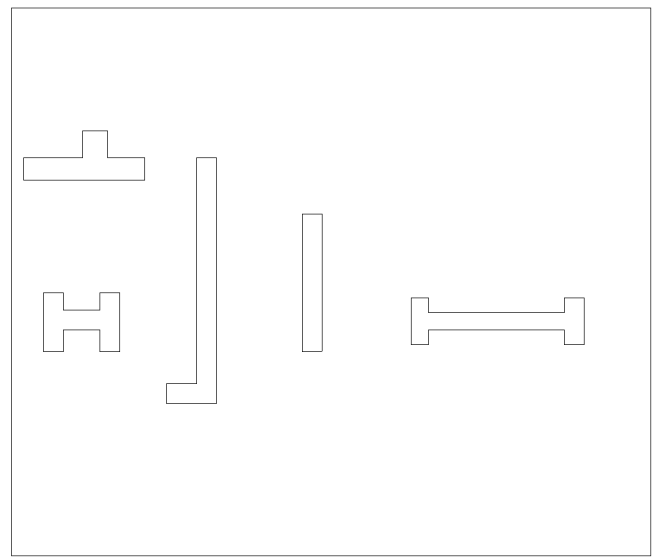

When forming metal wire trenches with small pitches, the pitch limit of a single mask often fails to meet the accuracy requirements, and a double-patterning process is usually used. Among the double-patterning processes, the litho-etch-litho-etch (LELE) process is a relatively common one. The LELE process needs to split the many layouts (as shown in FIG. 1) into two parts (as shown in FIG. 2 and FIG. 3), and then respectively generate portions of the patterns through the photolithography and etching step. However, the lithography process, the etching process, and the deposition process all produce edge placement error (EPE), which leads to deviations in vertical alignment among layers. Accordingly, the deviations in the spacings between the finally formed metal lines are also generated. Because the alignment deviations caused by the step-by-step etching process is uncontrollable, the spacings between the finally formed metal lines are also uncontrollable. Such uncontrollable issues will cause the spacings and designs among the formed metal lines not to meet the design requirement; and the performance of the final semiconductor device are adversely affected.

The present disclosure provides a semiconductor structure and a method for forming a semiconductor structure. In the method, the position of the subsequently formed third opening may be defined by the first core layer located on the first region. A first sidewall spacer may be formed on the first core layer, and the initial first opening may be formed by the self-aligned etching of the first sidewall spacer, which may reduce the position deviation of the initial first opening relative to the third opening. By adjusting the thickness of the second sidewall spacer, the adjustment of the spacings between each of the subsequently formed conductive layers may be realized, and the adjustment of the spacings between each of the conductive layers may be controllable to meet the requirements of the final electrical structure. Accordingly, the performance of the finally formed semiconductor structure may be improved.

To make the above objectives, features and advantages of the present disclosure more obvious and understandable, specific embodiments of the present disclosure will be described in detail below with reference to the accompanying drawings.

Figure 20:
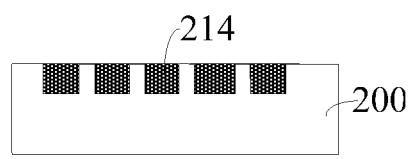
Figure 21:
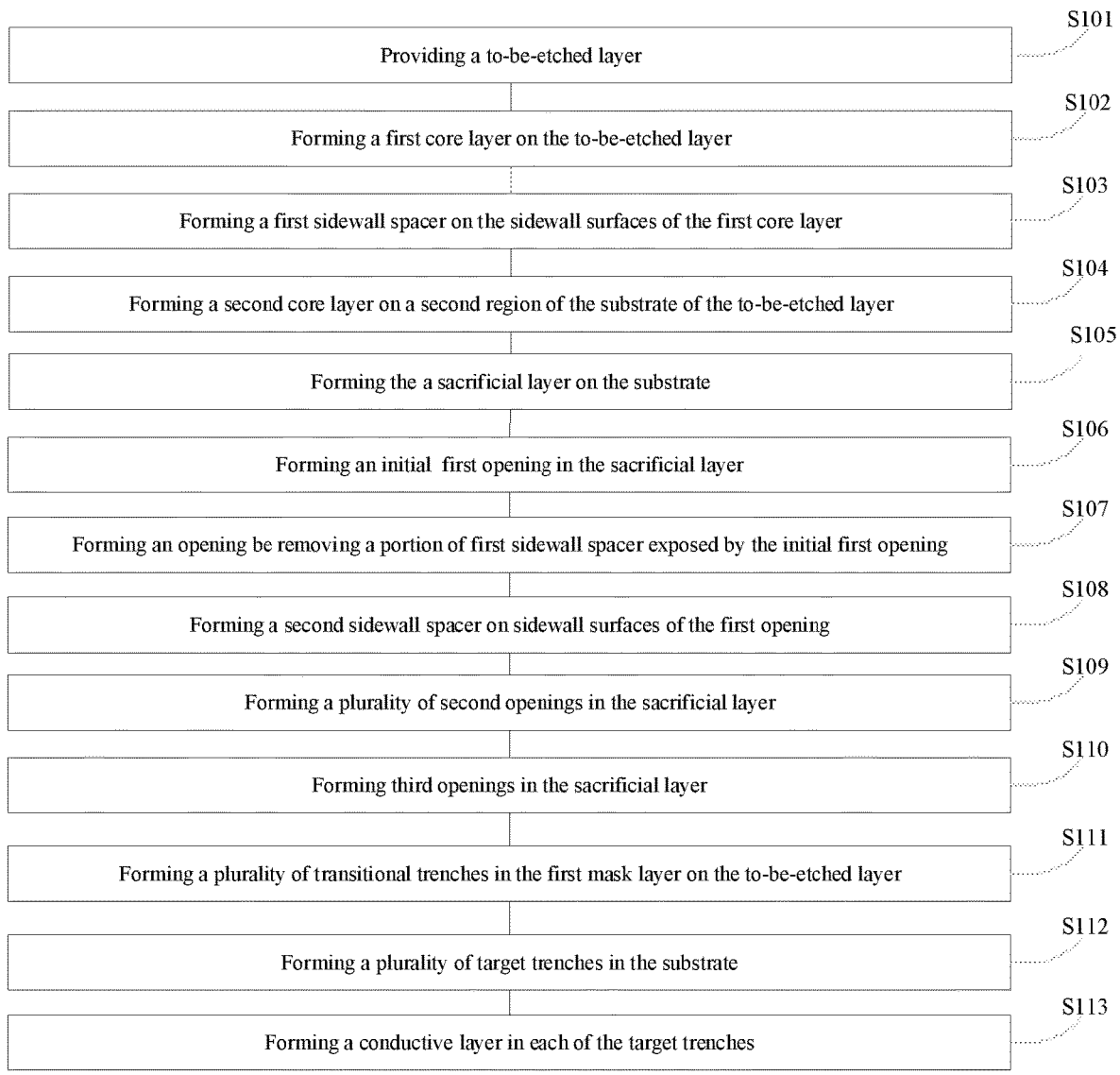
FIG. 21 illustrates an exemplary fabrication process of a semiconductor structure consistent with various disclosed embodiments of the present disclosure.

FIG. 21 illustrates an exemplary fabrication process of a semiconductor structure consistent with various disclosed embodiments of the present disclosure. FIGS. 4 to 20 are structures corresponding to certain stages during the exemplary fabrication process of a semiconductor structure consistent with various disclosed embodiments of the present disclosure.

Figure 4:
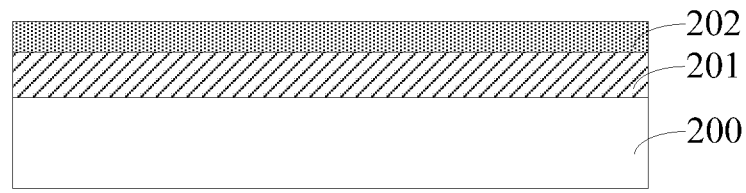
FIGS. 4-20 illustrate structures corresponding to certain stages during an exemplary fabrication process of a semiconductor structure consistent with various disclosed embodiments of the present disclosure.

As shown in FIG. 21, at the beginning of the fabrication process, a to-be-etched layer is provided (S101). FIG. 4 illustrates a corresponding structure.

As shown in FIG. 4, a to-be-etched layer is provided. In one embodiment, the to-be-etched layer may include a substrate 200 and a first mask layer 202 on the substrate 200.

In one embodiment, the material of the substrate 200 is a low-K sacrificial layer (K is less than or equal to 3.9). In some embodiments, the material of the substrate 200 may include silicon oxide.

The material of the first mask layer 202 may include one or more of titanium nitride, tungsten carbide, silicon oxide, silicon oxycarbide, and silicon oxycarbonitride, etc. In one embodiment, the material of the first mask layer 202 is silicon oxycarbide.

In one embodiment, the to-be-etched layer may further include a bottom hard mask layer 201. The bottom hard mask layer 201 may be formed on the substrate 200, and the first mask layer 202 may be formed on the bottom hard mask layer 201.

The bottom hard mask layer 201 may be used as a stop layer for the subsequent planarization of the conductive film. The material of the bottom hard mask layer 201 may be a hard mask material. Thus, when each target trench is subsequently formed by an etching process, the etching loss of the bottom hard mask layer 201 may be substantially small. Therefore, in the process of transferring the patterns in the bottom hard mask layer 201 to the substrate 200, the stability of the pattern transfer may be relatively high.

The bottom hard mask layer 201 may be a single-layer structure or a multi-layer structure. The material of the bottom hard mask layer 201 may include one or more of silicon oxide, titanium nitride, tungsten carbide, silicon carbide, silicon carbonitride, silicon oxycarbide, aluminum oxide, or aluminum nitride, etc. In one embodiment, the material of the bottom hard mask layer 201 is titanium nitride.

Figure 5:
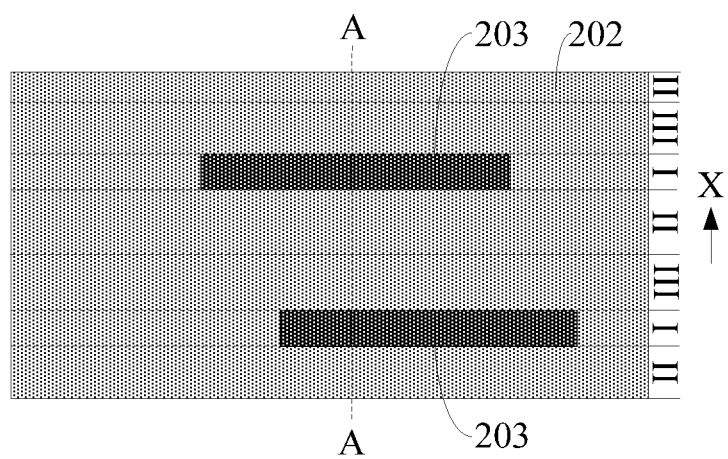
Figure 6:
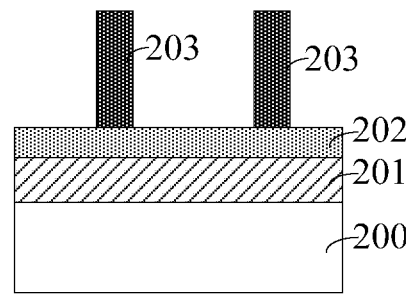

Returning to FIG. 21, after providing the substrate, a first core layer may be formed (S102). FIGS. 5-6 illustrate a corresponding structure. FIG. 6 is a schematic A-A-sectional view of FIG. 5.

As shown in FIGS. 5-6, the to-be-etched layer may include a plurality of first regions I, a plurality of second regions II, and a plurality of third regions III arranged in parallel along a first direction X. A second region II is adjacent to a first region I and a third region III. A first core layer 203 extending along a second direction Y may be formed on each first region I. The first direction X may be perpendicular to the second direction Y.

In one embodiment, the regions where the first regions I, the second regions II, and the third regions III are not specified are other regions where the first conductive layer or the second conductive layer may not be formed.

In one embodiment, the function of the first core layer 203 may be to define the position of the subsequently formed third opening.

In one embodiment, the method for forming the first core layer 203 may include forming a first core material layer (not shown) on the to-be-etched layer; and forming a first patterned layer (not shown) having a plurality of first patterned opening (not shown) exposing portions of the first core material layer on the first core material layer; and etching the first core material layer using the first patterned layer as a mask until the top surface of the to-be-etched layer is exposed to form the first core layer 203.

The material of the first core layer 203 may include one or more of polysilicon, amorphous silicon, silicon oxide, silicon nitride, and amorphous carbon, etc. In one embodiment, the material of the first core layer 203 is amorphous carbon.

Figure 7:
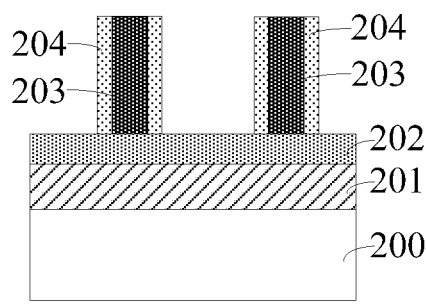

Returning to FIG. 21, after forming the first core layer 203, a first sidewall spacer may be formed (S103). FIG. 7 illustrates a corresponding structure. The view direction of FIG. 7 is same as the view direction of FIG. 6.

As shown FIG. 7, a first sidewall spacer 204 may be formed on the sidewall surfaces of the first core layer 203.

In one embodiment, the method for forming the first sidewall spacer 204 may include forming a first sidewall material layer on the sidewall surface and the top surface of the first core layer 203 and the top surface of the to-be-etched layer; and etching the first sidewall material layer until the top surface of the first core layer 203 and the to-be-etched layer are exposed to form the first sidewall spacer 204.

In one embodiment, the forming process of the first sidewall spacer material layer may include an atomic layer deposition process.

The material of the first sidewall spacer 204 may include one or more of silicon oxide, silicon nitride, aluminum oxide, aluminum nitride, titanium nitride, and titanium oxide. In one embodiment, the material of the first sidewall spacer 204 is aluminum nitride.

In one embodiment, after forming the first sidewall spacer 204, the method may further include forming a sacrificial layer covering portions of the first sidewall spacer 204 on the to-be-etched layer. The sacrificial layer may have multiple initial first openings, and the initial first openings may be located on the second region II. The initial first openings may extend along the second direction Y, and a portion of the initial first openings may expose a portion of the first sidewall spacer 204 in the second region II. The exemplary process for forming the sacrificial layer may refer to FIGS. 8-11.

Figure 8:
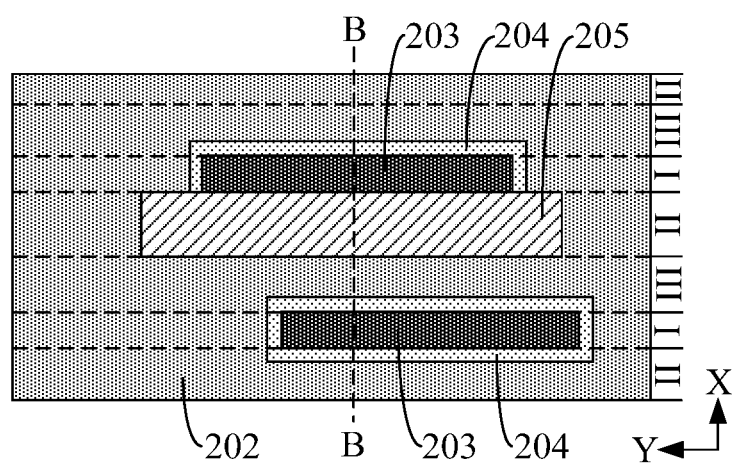
Figure 9:
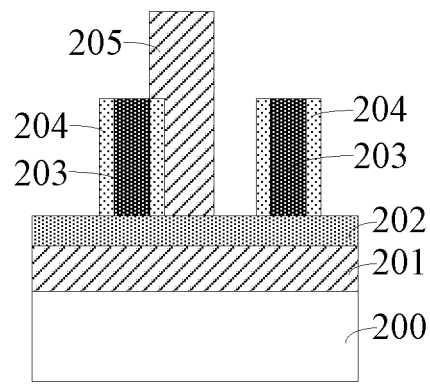

Returning to FIG. 21, after forming the first sidewall spacer, a second core layer may be formed (S104). FIGS. 8-9 illustrate a corresponding structure. FIG. 9 is a schematic B-B-sectional of FIG. 8.

As shown in FIGS. 8-9, a second core layer 205 may be formed on the second region II, and the second core layer 205 may extend along the second direction Y, and the second core layer 205 may cover a portion of the first sidewall spacer 204 in the second region II.

In one embodiment, the method for forming the second core layer 205 may include forming a second core material layer (not shown) on the to-be-etched layer; and forming a second patterned layer (not shown) on the second core material layer on the second core material layer. The second patterned layer may have a second patterned opening (not shown) exposing a portion of the second core material layer. The second core material layer may be etched using the second patterned layer as a mask until the top surface of the to-be-etched layer and the top surface of the first core layer 203 are exposed to form the second core layer 205.

In one embodiment, the material of the second core layer 205 may be different from the material of the first core layer 203. Such a configuration may avoid the damage to the first core layer 203 when the second core layer 205 is subsequently removed.

The material of the second core layer 205 may include organic material, silicon oxide, or amorphous carbon, etc. In one embodiment, silicon oxide is used as the second core layer 205.

Figure 10:
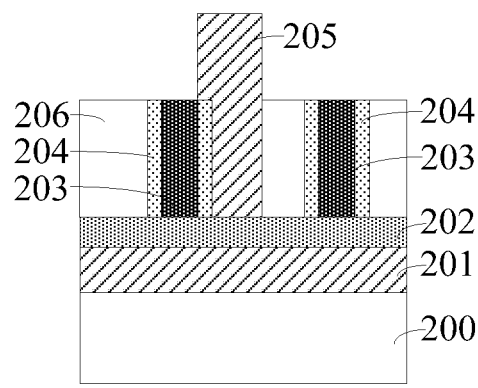

Returning to FIG. 21, after forming the second core layer, a sacrificial layer may be formed (S105). FIG. 10 illustrates a corresponding structure. The view directions of FIG. 10 may be same as the view direction of FIG. 9.

As shown in FIG. 10, an initial sacrificial layer (not shown) may be formed on the to-be-etched layer, and the initial sacrificial layer may cover the first sidewall spacer 204 and the first core layer 203. Then, the initial sacrificial layer may be etched back until the top surfaces of the first sidewall spacer 204 and the first core layer 203 are exposed to form the sacrificial layer 206.

The material of the sacrificial layer 206 may include spin-on silicon oxide, metal oxide, polysilicon, or amorphous silicon, etc. In one embodiment, the material of the sacrificial layer 206 is polysilicon.

The process for etching back the initial sacrificial layer may include one or more of a wet etching process and a dry etching process, etc. In one embodiment, the process for etching back the initial sacrificial layer includes a wet etching process.

Figure 11:
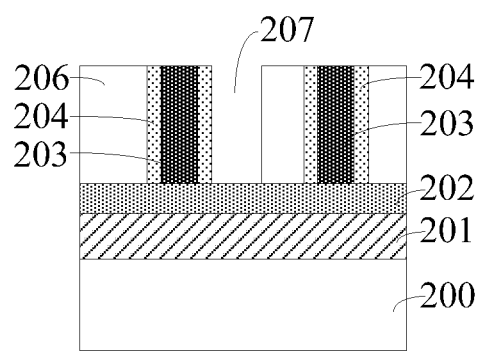

Returning to FIG. 21, after forming the sacrificial layer, an initial first opening may be formed (S106). FIG. 11 illustrates a corresponding structure.

As shown in FIG. 11, after forming the sacrificial layer 206, the second core layer 205 may be removed to form an initial first opening 207.

Because the material of the second core layer 205 is different from the materials of the sacrificial layer 206, the first sidewall spacer 204, and the first core layer 203, the second core layer 205 may be removed by using the self-alignment of different materials. Accordingly, the position deviation of the initial first opening 207 relative to the subsequently formed third opening may be reduced.

In one embodiment, the process for removing the second core layer 205 includes a wet etching process. In some embodiments, the process for removing the second core layer 205 may also include a dry etching process.

Figure 12:
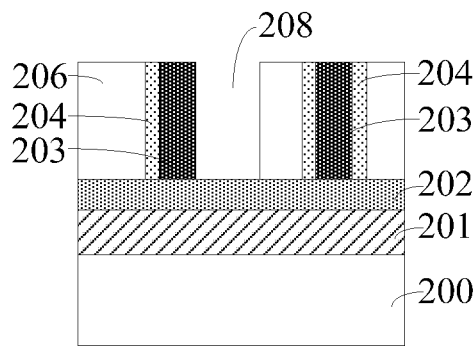

Returning to FIG. 21, after forming the initial first opening, a first opening may be formed (S107). FIG. 12 illustrates a corresponding structure.

As shown in FIG. 12, the portion the first sidewall spacer 204 exposed by the initial first opening 207 may be removed to form a first opening 208.

Because the material of the first sidewall spacer 204 may be different from the material of the first core layer 203, the self-alignment between different materials may be used to remove the portion of the first sidewall spacer 204 exposed by the initial first opening 207.

In one embodiment, the process for removing the portion of the first sidewall spacer 204 may include a wet etching process. In some embodiments, the process for removing the portion of the first sidewall spacer may also include a dry etching process.

Figure 13:
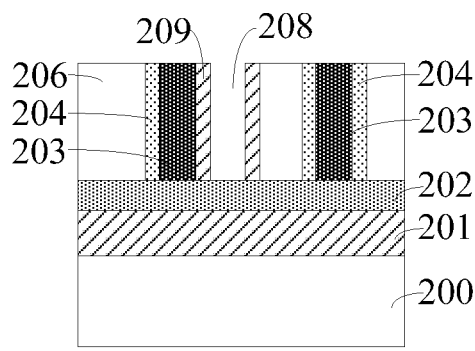

Returning to FIG. 21, after forming the first opening, a second sidewall spacer may be formed (S108). FIG. 13 illustrates a corresponding structure.

As shown in FIG. 13, a second sidewall spacer 209 may be formed on the sidewall surfaces of the first opening 208.

In one embodiment, the method for forming the second sidewall spacer 209 may include forming a second sidewall material layer (not shown) on the sidewall surfaces and the bottom surface of the first opening 208, and the top surfaces of the first core layer 203, the first sidewall spacer 204, and the sacrificial layer 206; and etching back the second sidewall material layer until the top surfaces of the first core layer 203, the first sidewall spacer 204 and the sacrificial layer 206 and the bottom surface of the first opening 208 are exposed to form the second sidewall spacer 209.

In one embodiment, the material of the first sidewall spacer 204 and the second sidewall spacer 209 may be same, and the material of the second sidewall spacer 209 is aluminum nitride. In some embodiments, the materials of the second sidewall spacer and the first sidewall spacer may also be different.

In one embodiment, the thickness of the first sidewall spacer 204 and the second sidewall spacer 209 may be same. The thickness direction may be the direction along the first direction X. By setting the thickness of the first sidewall spacer 204 and the second sidewall spacer 209 to be same, the spacing between the subsequently formed conductive layers may also be same, the deviation of the electrical properties of the conductive layers may be reduced. Accordingly, the performance of the final semiconductor structure may be improved.

In some embodiments, the thickness of the first sidewall spacer and the second sidewall spacer may be different.

Figure 14:
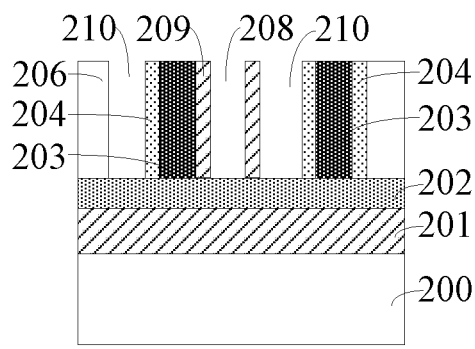

Returning to FIG. 21, after forming the second sidewall spacer, a plurality of second openings may be formed in the sacrificial layer (S109). FIG. 14 illustrates a corresponding structure.

As shown in FIG. 14, a plurality of second openings 210 may be formed in the sacrificial layer 206. The second openings 210 may expose one or both of a portion of the first sidewall spacer 204 and a portion of the second sidewall spacer 209.

In this embodiment, a portion of second openings 210 may be located on the third area III, and a portion of the second openings 210 may be located on the second area II and the third area III.

Because the material of the sacrificial layer 206 may be different from the material of the first sidewall spacer 204, the second opening 210 may be formed by the self-aligned etching of the first sidewall spacer 204, or the second opening 210 may be formed by the self-aligned etching of the first sidewall spacer 204 and the second sidewall spacer 209, the position deviation of the second opening 210 with respect to the subsequently formed third opening may be reduced.

The process for forming the second openings 210 in the sacrificial layer 206 may include a wet etching process, or a dry etching process, etc. In one embodiment, the process for forming the second openings 210 in the sacrificial layer 206 includes a wet etching process.

Figure 15:
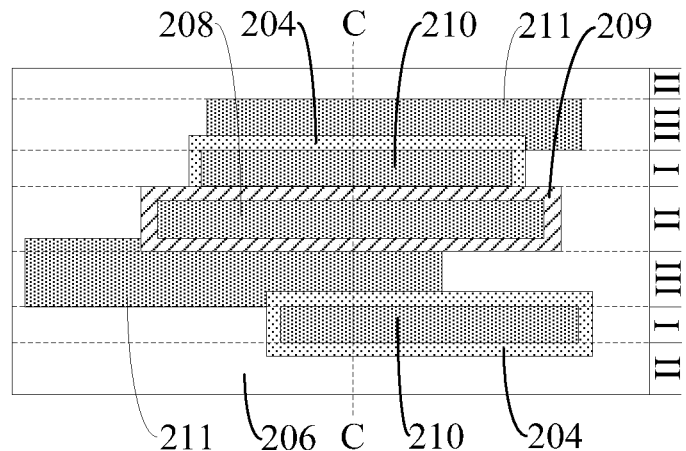
Figure 16:
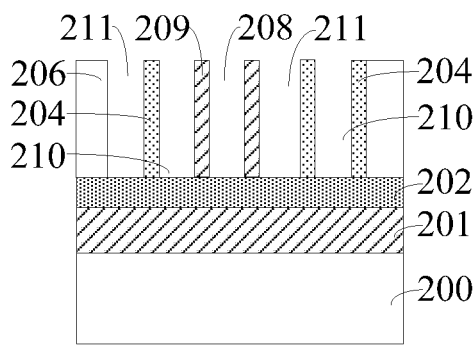

Returning to FIG. 21, after forming the second openings, third openings may be formed (S110). FIGS. 15-16 illustrate a corresponding structure. FIG. 16 is a schematic C-C-sectional view of FIG. 15.

As shown in FIGS. 15-16, the first core layer 203 may be removed, and third openings 211 may be formed in the sacrificial layer 206.

The first core layer 203 may formed on the plurality of the first regions I first, and the positions of the subsequent third openings 211 may be defined by the first core layer 203. The first sidewall spacers 204 may be formed on the first core layer 203, and the initial first openings 207 and the second openings 210 may be formed by the self-aligned etching of the first sidewall spacers 204, the deviation of the initial positions of the first openings 207 and the second openings 210 relative to the third openings 211 may be reduced. By adjusting the thickness of the first sidewall spacers 204 and the second sidewall spacers 209, the adjustment of the spacing between each of the subsequently formed conductive layers may be realized. Accordingly, the adjustment of the spacing between each of the conductive layers may be controllable to achieve the requirements of the final electrical structure, and then the performance of the finally formed semiconductor structure may be enhanced.

Because the first core layer 203 may have a different material than the first sidewall spacers 204, the second sidewall spacers 209, and the sacrificial layer 206, the first core layer 203 may be removed by the self-alignment between different materials.

The process for removing the first core layer 203 may include a wet etching process, or a dry etching process, etc. In one embodiment, the process for removing the first core layer 203 includes a wet etching process.

Figure 17:
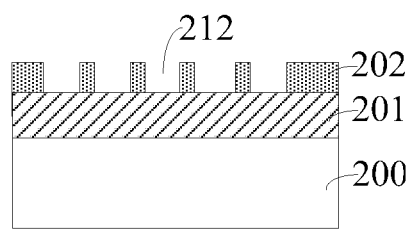

Returning to FIG. 21, after forming the second openings, a plurality of transitional trenches may be formed in the first mask layer (S110). FIG. 17 illustrates a corresponding structure (S111).

As shown in FIG. 17, after removing the first core layer 203, the first mask layer 202 may be etched using the sacrificial layer 206, the first sidewall spacers 204, and the second sidewall spacers 209 as an etching mask to form a plurality of transitional trenches 212 in the first mask layer 202.

In one embodiment, a dry etching process is used to etch the first mask layer 202. In some embodiments, a wet etching process or a combination of a dry etching and a wet etching may also be used to remove the first mask layer.

Figure 18:
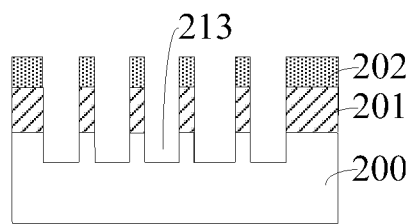

Returning to FIG. 21, after forming the plurality of transitional trenches, a plurality of target trenches may be formed (S112). FIG. 18 illustrates a corresponding semiconductor structure.

As shown in FIG. 18, after forming the plurality of transitional trenches 212, the substrate 200 may etched using the first mask layer 202 as a mask to form a plurality of target trenches 213 in the substrate 200. In one embodiment, during the process for etching the substrate 200, the method may further include etching the bottom hard mask layer 201.

The process for etching the bottom hard mask layer 201 and the substrate 200 using the first mask layer 202 as a mask may include one or a combination of a dry etching process and a wet etching process. In one embodiment, the process for etching the bottom hard mask layer 201 and the substrate 200 includes a dry etching process and a wet etching process.

In one embodiment, after forming the plurality of the target trenches 213, the first mask layer 202 and the bottom hard mask layer 201 may be kept first. In some embodiments, after forming the plurality of the target trenches, a portion of the mask layer may be removed first, for example, the first mask layer may be removed first.

Figure 19:
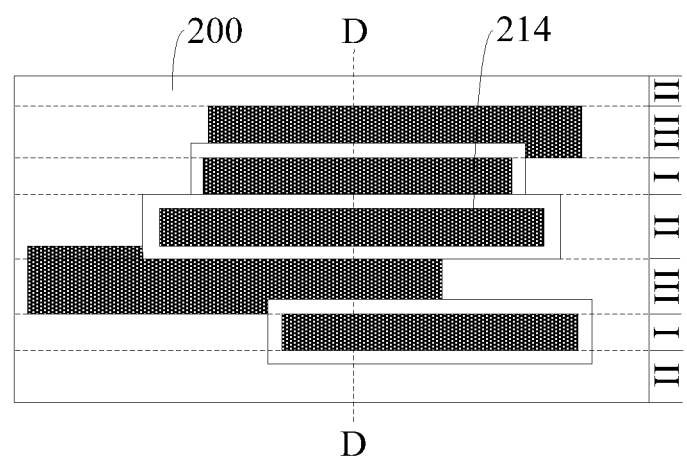

Returning to FIG. 21, after forming the plurality of target trenches, conductive layers may be formed (S111). FIGS. 19-20 illustrate a corresponding structure. FIG. 20 is a schematic D-D-sectional view of FIG. 19.

As shown in FIGS. 19-20, after forming the plurality of the target trenches 213, a conductive layer 214 may be formed in etch of the plurality of target trenches 213, respectively.

In one embodiment, the method for forming the conductive layer 214 may include forming a conductive film (not shown) in the plurality of target trenches 213 and to cover the first mask layer 202; and planarizing the conductive film, the first mask layer 202 and the bottom hard mask layer 201 until the substrate 200 is exposed. Thus, a conductive layer 214 is formed in each of the target trenches 213, respectively.

The material of the conductive layer 214 may include one or more of copper, aluminum, tungsten, cobalt, tantalum, tantalum nitride, titanium, titanium nitride, ruthenium, ruthenium nitride, and graphene, etc. In one embodiment, the conductive layer 214 is made of copper and tantalum nitride. Tantalum nitride may be used as a barrier layer for the diffusion of copper.

The present disclosure also provides a semiconductor structure. FIGS. 19-20 illustrate an exemplary semiconductor structure consistent with various disclosed embodiments of the present disclosure. FIG. 20 is a D-D-sectional view of FIG. 19.

As shown in FIGS. 19-20, the semiconductor structure may include a substrate 200 having a plurality parallel first regions I, a plurality of parallel second regions II and a plurality of parallel third regions III. A first region I may be adjacent to a second region II and a third region III. Further, the semiconductor structure includes a conductive layer 214 formed in each of the plurality of first regions I, the plurality of second regions II and the plurality of third regions III. The detailed structures and intermediate structures are described above with respect to the fabrication processes.

Thus, the technical solutions of the present disclosure may have the following advantages.

In the technical solutions of the present disclosure, a first core layer may be formed on a plurality of the first regions first, and the first core layer may define the positions of the subsequent third openings. A first sidewall spacer may be formed on the first core layer, and the initial first openings and the second openings may be formed by the self-aligned etching of the first sidewall spacer. Thus, the position deviation of the initial first opening and the second opening relative to the third opening may be reduced. By adjusting the thickness of the first sidewall spacer and the second sidewall spacer, the adjustment of the spacings between each of the subsequently formed conductive layers may be achieved. Accordingly, the adjustment of the spacings between each of the conductive layers may be controllable to realize the requirements of the final electrical structure. Thus, the performance of the final formed semiconductor structure may be improved.

Further, the thickness of the first sidewall spacer and the second sidewall spacer may be same. By setting the thickness of the first sidewall spacer and the second sidewall spacer to be the same, the spacings between the subsequently formed conductive layers may also be same. Thus, the deviation of the electrical performance between the conductive layers may be reduced, and the performance of the final semiconductor structure may be improved.

Although the present disclosure is disclosed as above, the present disclosure is not limited to this. Any person skilled in the art can make various changes and modifications without departing from the spirit and scope of the present disclosure. Therefore, the protection scope of the present disclosure should be subject to the scope defined by the claims.

What is claimed is:

1. A method for forming a semiconductor structure, comprising:
   providing a to-be-etched layer, wherein the to-be-etched layer includes a plurality of first regions arranged in parallel along a first direction, a plurality of second regions arranged in parallel along the first direction and a plurality of third regions arranged in parallel along the first direction, and a second region of the plurality of second regions is adjacent to a first region of the plurality of first regions and a third region of the plurality of third regions;
   forming a first core layer on the first region of the plurality of first regions, wherein the first core layer extends along a second direction perpendicular to the first direction;
   forming a first sidewall spacer on sidewall surfaces of the first core layer;
   forming a sacrificial layer covering a portion of the first sidewall spacer on the to-be-etched layer, wherein the sacrificial layer includes a plurality of initial first openings, an initial first opening of the plurality of initial first openings is on the second region, the initial first opening extends along the second direction, and a portion of the initial first opening exposes a portion of the first sidewall spacer on the second region;
   removing the portion of the first sidewall spacer exposed by the portion of the initial first opening to form a first opening;
   forming a second sidewall spacer in the first opening; and
   forming a plurality of second openings in the sacrificial layer, wherein a second opening of the plurality of second openings exposes one of or both the portion of the first sidewall spacer and a portion of the second sidewall spacer.

2. The method according to claim 1, wherein forming the first core layer comprises:
   forming a first core material layer on the to-be-etched layer;
   forming a first patterned layer on the first core material layer, wherein the first patterned layer includes a first patterned opening exposing a portion of the first core material layer; and
   etching the first core material layer using the first patterned layer as a mask until a top surface of the to-be-etched layer is exposed to form the first core layer.

3. The method according to claim 1, wherein forming the first sidewall spacer comprises:
   forming a first sidewall spacer material layer on the sidewall surfaces and a top surface of the first core layer and a top surface of the to-be-etched layer; and
   etching the first sidewall spacer material layer until the top surface of the first core layer and the top surface of the to-be-etched layer are exposed to form the first sidewall spacer.

4. The method according to claim 3, wherein:
   the first sidewall spacer material layer is formed by a process including an atomic layer deposition process.

5. The method according to claim 1, wherein forming the sacrificial layer and the plurality of initial first openings comprises:
   forming a second core layer on the second region, wherein the second core layer extends along the second direction and covers a portion of the first sidewall spacer;
   forming an initial sacrificial layer covering the first sidewall spacer and the first core layer on the to-be-etched layer;
   etching back the initial sacrificial layer until a top surface of the first sidewall spacer and the top surface of the first core layer are exposed to form the sacrificial layer; and
   after removing the sacrificial layer, removing the second core layer to form the plurality of first openings.

6. The method according to claim 5, wherein:
   a method for etching back the initial sacrificial layer includes one or more of a dry etching process and a wet etching process.

7. The method according to claim 5, wherein forming the second core layer comprises:
   forming a second core material layer on the to-be-etched layer;
   forming a second patterned layer having a second patterned opening exposing a portion of the second core material layer on the second core material layer; and
   etching the second core material layer using the second patterned layer as a mask until the top surface of the to-be-etched layer is exposed to form the second core layer.

8. The method according to claim 5, wherein:
   a material of the second core material layer includes an organic material, silicon oxide, or amorphous carbon.

9. The method according to claim 1, wherein:
   a material of the first core layer includes one or more of polysilicon, amorphous silicon, silicon oxide, silicon nitride, and amorphous carbon.

10. The method according to claim 1, wherein:
    a thickness of the first sidewall spacer is same as a thickness of the second sidewall spacer;
    a material of the first sidewall spacer is same as a material of the second sidewall spacer; and
    the material of the first sidewall spacer and the second sidewall spacer includes one or more of silicon oxide, silicon nitride, aluminum oxide, aluminum nitride, titanium nitride and titanium oxide.

11. The method according to claim 1, wherein:
a material of the sacrificial layer includes spin-coated silicon oxide, metal oxide, polysilicon, or amorphous silicon.

12. The method according to claim 1, after forming the plurality of second openings, further comprising:
removing the first core layer to form a plurality of third openings in the sacrificial layer.

13. The method according to claim 12, wherein:
the to-be-etched layer includes a substrate and a first mask layer on the substrate.

14. The method according to claim 13, after removing the first core layer, further comprising:
etching the first mask layer using the sacrificial layer, the first sidewall spacer and the second sidewall spacer as a mask to form a plurality of transitional trenches in the first mask layer.

15. The method according to claim 14, after forming the plurality of transitional trenches, further comprising:
etching the substrate using the first mask layer as a mask to form a plurality of target trenches in the substrate.

16. The method according to claim 15, after forming the plurality of target trenches, further comprising:
forming a conductive layer in each of the plurality of target trenches, respectively.

* * * * *